United States Patent
Kim et al.

(10) Patent No.: US 7,538,573 B2
(45) Date of Patent: May 26, 2009

(54) DYNAMIC OUTPUT BUFFER CIRCUIT

(75) Inventors: Jae-kwan Kim, Seongnam-si (KR); Joo-sun Choi, Yongin-si (KR)

(73) Assignee: Samsung Electronics Co., Ltd. (KR)

(*) Notice: Subject to any disclaimer, the term of this patent is extended or adjusted under 35 U.S.C. 154(b) by 0 days.

(21) Appl. No.: 11/705,251

(22) Filed: Feb. 12, 2007

(65) Prior Publication Data
US 2007/0200592 A1 Aug. 30, 2007

(30) Foreign Application Priority Data
Feb. 28, 2006 (KR) ............... 10-2006-0019343

(51) Int. Cl.
*H03K 17/16* (2006.01)
(52) U.S. Cl. .................. 326/30; 326/86
(58) Field of Classification Search ............ 326/21, 326/26, 30–34, 81–83, 86–87; 327/108–109, 327/112
See application file for complete search history.

(56) References Cited

U.S. PATENT DOCUMENTS

| | | | |
|---|---|---|---|
| 6,288,563 B1* | 9/2001 | Muljono et al. | 326/27 |
| 6,674,313 B2 | 1/2004 | Kurisu et al. | |
| 6,762,620 B2* | 7/2004 | Jang et al. | 326/30 |
| 6,977,534 B2* | 12/2005 | Radelinow | 327/112 |
| 7,164,299 B2* | 1/2007 | Nedachi | 327/112 |
| 7,215,144 B2* | 5/2007 | Mitby et al. | 326/82 |
| 2007/0057702 A1* | 3/2007 | Suenaga | 327/108 |

FOREIGN PATENT DOCUMENTS

| | | |
|---|---|---|
| JP | 2005-217999 | 8/2005 |
| KR | 10-0433019 | 5/2004 |
| KR | 10-2005-0064897 | 6/2005 |

\* cited by examiner

*Primary Examiner*—Rexford Barnie
*Assistant Examiner*—Christopher Lo
(74) *Attorney, Agent, or Firm*—Mills & Onello, LLP

(57) ABSTRACT

A dynamic output buffer circuit performs an impedance matching function and a pre-emphasis function by using input and output signals, and consumes relatively less power, occupies a relatively smaller layout area, and dynamically varies an output impedance. The dynamic output buffer circuit dynamically matches an output impedance to the characteristic impedance of a metal line connected to an external circuit, pre-emphasizes at least one input signal, and includes a control circuit and an output circuit. The control circuit matches the output impedance of the dynamic output circuit to the characteristic impedance of the metal line in response to at least one output signal, and outputs a plurality of resistor control signals which are used to pre-emphasize at least one input signal in response to the input signal. The output circuit controls the output impedance and pre-emphasizes the input signal in response to the resistor control signals, and outputs the output signal.

9 Claims, 4 Drawing Sheets

DYNAMIC OUTPUT BUFFER CIRCUIT

CROSS-REFERENCE TO RELATED PATENT APPLICATION

This application claims priority to Korean Patent Application No. 10-2006-0019343, filed on Feb. 28, 2006, in the Korean Intellectual Property Office, the disclosure of which is incorporated herein in its entirety by reference.

BACKGROUND OF THE INVENTION

1. Field of the Invention

The present invention relates to an output circuit, and more particularly, to a dynamic output buffer circuit for performing an impedance matching function and a pre-emphasis function by using input and output signals.

2. Description of the Related Art

In modeling a common conducting wire, the variation of the electrical characteristics of the wire depending on the frequency of the signal flowing through the wire and the length of the wire are to be taken into account. For example, if the signal flowing through the wire has a low frequency, and thus the wavelength of the signal is larger than the length of the wire, then only the resistive and capacitive components of the wire need to be considered in modeling the wire. On the other hand, if the signal flowing through the wire has a high frequency, and thus the wavelength of the signal is far shorter than the length of the wire, then electromagnetic characteristics also are to be considered in modeling the wire. Therefore, under such high frequency conditions, an impedance component, rather than just the resistive component, has to be considered along with the capacitive component. The impedance of a component is generally referred to as the characteristic impedance of the component.

A conductive line, or metal line, is physically connected between semiconductor chips or systems to transfer signals. The characteristic impedance of the metal line is assumed to be Zo. If the input impedances of the semiconductor chips and the systems connected by the metal line do not match the characteristic impedance Zo of the metal line, then impedance matching is not achieved, and signal reflection can occur. A reflected signal interferes with the original signal, altering the characteristics of input and output signals.

Inter symbol interference (ISI) occurs when a signal is applied before the previous signal reaches a desired voltage, and thus the signal is influenced by the previous signal. ISI generally occurs when a signal has a high frequency, i.e. a short wavelength.

In order to reduce signal refection and ISI in response to a frequency of a transmitted/received signal, an impedance matching circuit and a pre-emphasis circuit are used. The impedance matching circuit is used to match the output impedance of an output terminal of a semiconductor chip to the characteristic impedance Zo of the metal line. The pre-emphasis circuit is used to amplify the edges of a transmitting signal, thereby reducing ISI.

FIG. 1 illustrates an impedance matching circuit between two chips.

Referring to FIG. 1, a metal line connects two chips Chip I and Chip II, and has a characteristic impedance Zo. The output impedance Zout of the first chip Chip I and the input impedance Zin of the second chip Chip II are adjusted to coincide with the characteristic impedance Zo of the metal line.

FIG. 2 is a waveform diagram of a signal and its corresponding pre-emphasized signal.

Referring to FIG. 2, a pre-emphasized signal PE-Signal is defined as a signal of which the voltage at a rising edge and a falling edge are amplified. The signal is transmitted after the voltage at its edges is amplified. In this case, the voltage is amplified for only part of the entire period. Since the edges of the signal are amplified, the signal can have a sufficient amplitude required to be transmitted in practice within a period of signal transmission, even if the signal has a long settling time.

FIG. 3 illustrates an output circuit which performs an impedance matching function and a pre-emphasis function.

Referring to FIG. 3, an output circuit 300 includes an on-die termination (ODT) circuit 310 and a pre-emphasis circuit 320, 330.

The ODT circuit 310 includes a plurality of sub-cells having two P-type metal oxide semiconductor (MOS) transistors having gates which receive the same control signal and resistors which are respectively connected in series with the transistors. A second resistor R2 included in a sub-cell to which a second control signal C2 is applied has twice the resistance of a first resistor R1 included in a sub-cell to which a first control signal C1 is applied. A third resistor R3 included in a sub-cell to which a third control signal C3 is applied has twice the resistance of the second resistor R2. A fourth resistor R4 included in a sub-cell to which a fourth control signal C4 is applied has twice the resistance of the third resistor R3. In this manner, the control signals C1 to C4 are adjusted, and thus the output impedance can be adjusted in accordance with the resistors R1, R2, R3, R4 connected in parallel.

The pre-emphasis circuit 320, 330 amplifies the edge portions of the output signal by using signals PE-DI1 and PE-DI2 which have information on the portions at which signal transition occurs.

An output circuit 300 operates according to a first bias voltage Vb1 and a second bias voltage Vb2. When the output circuit 300 operates normally, signals DI1 and DI2 are transmitted to another chip or system.

In the conventional output circuit 300 of FIG. 3, the control signals C1 to C4 are generally obtained from a fuse circuit. Fusing is performed to match the output impedance with the characteristic impedance Zo of the metal line. Such fusing can only be performed a single time for each chip. Thus, after the output impedance is set, it cannot be altered. In addition, the MOS transistors of the pre-emphasis circuit 320, 330 to which the signals PE-DI1 and PE-DI2 are applied occupy a significantly large area on a layout.

The output circuit 300 is connected to all output terminals of a semiconductor chip. As described above, when the pre-emphasis circuit 320, 330 is connected to all of the output terminals, the semiconductor chip requires a larger area, and thus more power is consumed. In addition, since the output impedance is invariable, the output circuit 300 cannot actively cope with variation in the characteristic impedance Zo of the metal line, which occurs, for example, when the metal line is replaced.

SUMMARY OF THE INVENTION

The present invention provides a dynamic output buffer circuit which consumes relatively lower power, occupies a relatively small area, and in which an output impedance can be varied.

According to an aspect of the present invention, there is provided a dynamic output buffer circuit which matches an output impedance to a characteristic impedance of a metal line connected to an external circuit, and pre-emphasizes at least one input signal. The dynamic output buffer circuit comprises: a control circuit which matches the output impedance of the dynamic output circuit to the characteristic impedance of the metal line in response to at least one output signal, and outputs a plurality of resistor control signals which are used to pre-emphasize at least one input signal in response to the input signal; and an output circuit which controls the output impedance and pre-emphasizes the input signal in response to the resistor control signals, and which outputs the output signal.

In one embodiment, the control circuit comprises: a pre-emphasis circuit which detects edges of the input signal, and outputs a pre-emphasis control signal indicating that the input signal is to be amplified for a time period relative to a rising edge and a falling edge of the input signal; an impedance matching circuit which outputs an impedance matching control signal indicating whether the output impedance of the dynamic output circuit matches the characteristic impedance of the metal line, in response to the output signal and a reference signal; and a resistor circuit which outputs the resistor control signals in response to the pre-emphasis control signal and the impedance matching control signal.

In another embodiment, the dynamic output buffer circuit of claim 2, wherein the pre-emphasis circuit comprises at least one edge detector which detects edges of the input signal.

In another embodiment, the reference signal has a median value in the swing range of a peak-to-peak voltage of the output signal of the dynamic output buffer circuit.

In another embodiment, the control circuit further comprises a reference voltage generating circuit which generates the reference voltage.

In another embodiment, the impedance matching circuit comprises at least one comparator of which a first input terminal receives the output signal, a second input terminal receives the reference voltage, and an output terminal is connected to the resistor circuit.

In another embodiment, the resistor circuit modifies the resistor control signals in response to the impedance matching control signal and the pre-emphasis control signal.

In another embodiment, the output circuit comprises: a dynamic ODT (on die termination) which operates in response to the resistor control signals, and is connected to an output terminal that outputs the output signal; and an input stage which operates in response to the input signal, and is connected to the output terminal.

In another embodiment, the ODT comprises: a first ODT block which operates in response to a first resistor control signal; a second ODT block which operates in response to a second resistor control signal; and an Nth ODT block which operates in response to an Nth resistor control signal, where N is an integer.

In another embodiment, the first ODT block comprises: a first MOS transistor of which a first terminal is connected to a first power voltage, and of which a gate receives the first resistor control signal; a second MOS transistor of which a first terminal is connected to the first power voltage, and of which a gate receives the first resistor control signal; a first resistor of which a first terminal is connected to a second terminal of the first MOS transistor, and of which a second terminal is connected to a first output terminal; and a second resistor of which a first terminal is connected to a second terminal of the second MOS transistor, and of which a second terminal is connected to a second output terminal; the second ODT block comprises: a first MOS transistor of which a first terminal is connected to the first power voltage, and of which a gate receives the second resistor control signal; a second MOS transistor of which a first terminal is connected to the first power voltage, and of which a gate receives the second resistor control signal; a first resistor of which a first terminal is connected to a second terminal of the first MOS transistor, and of which a second terminal is connected to the first output terminal; and second resistor of which a first terminal is connected to a second terminal of the second MOS transistor, and of which a second terminal is connected to the second output terminal; and the Nth ODT comprises: a first MOS transistor PN1 of which a first terminal is connected to the first power voltage, and of which a gate receives the Nth resistor control signal; a second MOS transistor of which a first terminal is connected to the first power voltage, and of which a gate receives the Nth resistor control signal; a first resistor of which a first terminal is connected to a second terminal of the first MOS transistor, and of which a second terminal is connected to the first output terminal; and a second resistor of which a first terminal is connected to a second terminal of the second MOS transistor, and of which a second terminal is connected to the second output terminal.

In another embodiment, resistors included in a same one of the first, second and Nth ODT blocks all have the same resistance, and resistors included in a next higher order ODT block all have double that resistance.

In another embodiment, the input stage comprises: a first input transistor of which a first terminal is connected to the first output terminal, and of which a gate receives the first input signal; a second input transistor of which a first terminal is connected to the second output terminal, and of which a gate receives the second input signal; and a bias transistor of which a first terminal is connected to a second terminal of the first input transistor and a second terminal of the second input transistor, of which a second terminal is connected to a second power voltage, and of which a gate receives a bias signal.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF EMBODIMENTS OF THE INVENTION

Figure 1:
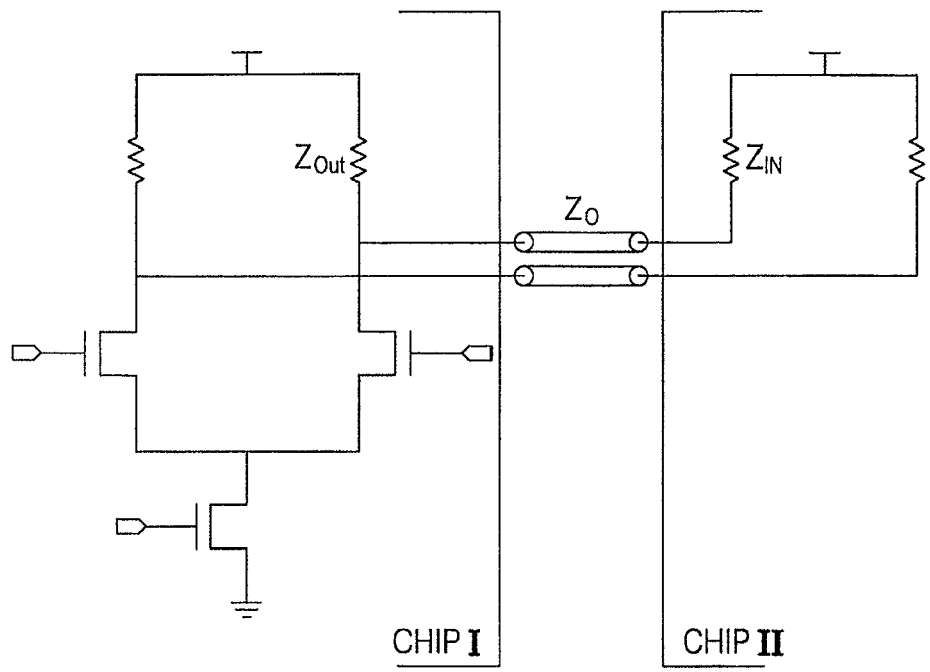
FIG. 1 illustrates conventional characteristics of impedance matching between two chips.
Figure 2:
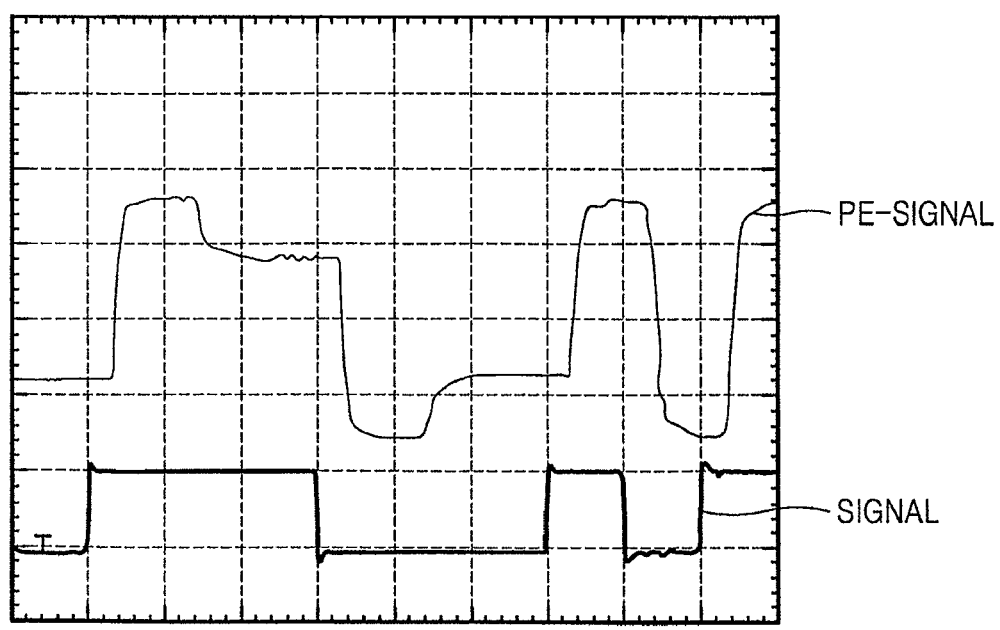
FIG. 2 is a waveform diagram of a signal and its corresponding pre-emphasized signal.

The attached drawings illustrate exemplary embodiments of the present invention and are referred to in order to gain a sufficient understanding of the present invention and its merits and objectives. Example embodiments of the present invention will now be described in detail with reference to the attached drawings. Like reference numerals denote like elements in the drawings.

Figure 4:
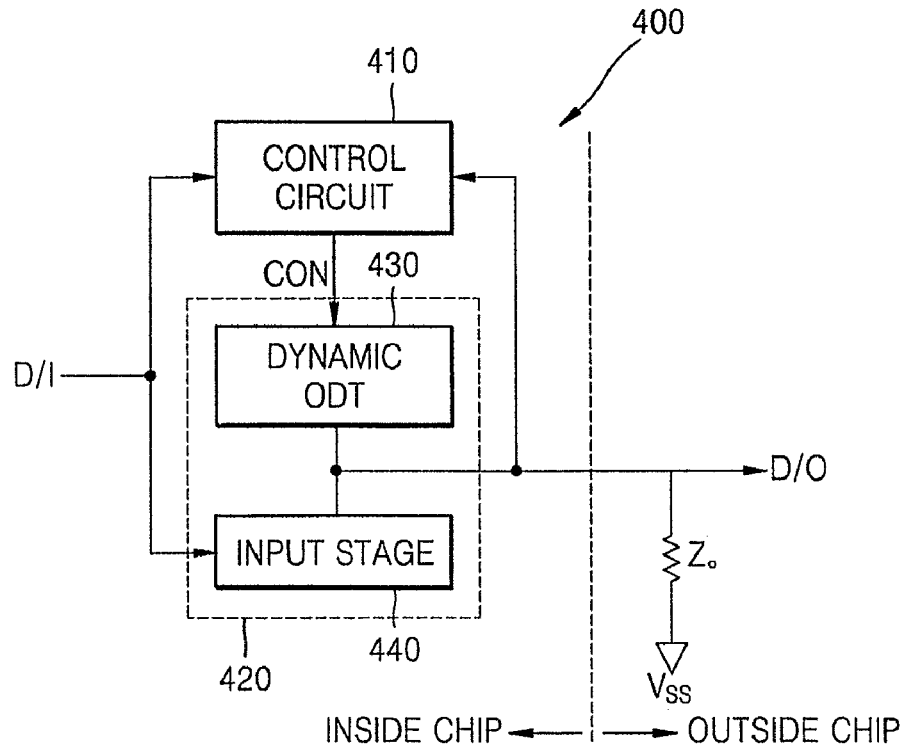
FIG. 4 is a block diagram of a dynamic output buffer circuit according to an embodiment of the present invention.

FIG. 4 is a block diagram of a dynamic output buffer circuit according to an embodiment of the present invention.

Referring to FIG. 4, a dynamic output buffer circuit 400 includes a control circuit 410 and an output circuit 420.

The control circuit 410 matches the characteristic impedance of a metal line with the output impedance of the dynamic output circuit in response to at least one output signal D/O, and outputs a plurality of resistor control signals CON which are used to pre-emphasize at least one input signal D/I in response to the input signal D/I. The control circuit 410 will be described below with reference to FIG. 5.

In response to the resistor control signals CON, the output circuit 420 controls an output impedance, and pre-emphasizes the input signal D/I so as to output the output signal D/O. The output circuit 420 will be described below with reference to FIG. 6.

Figure 5:
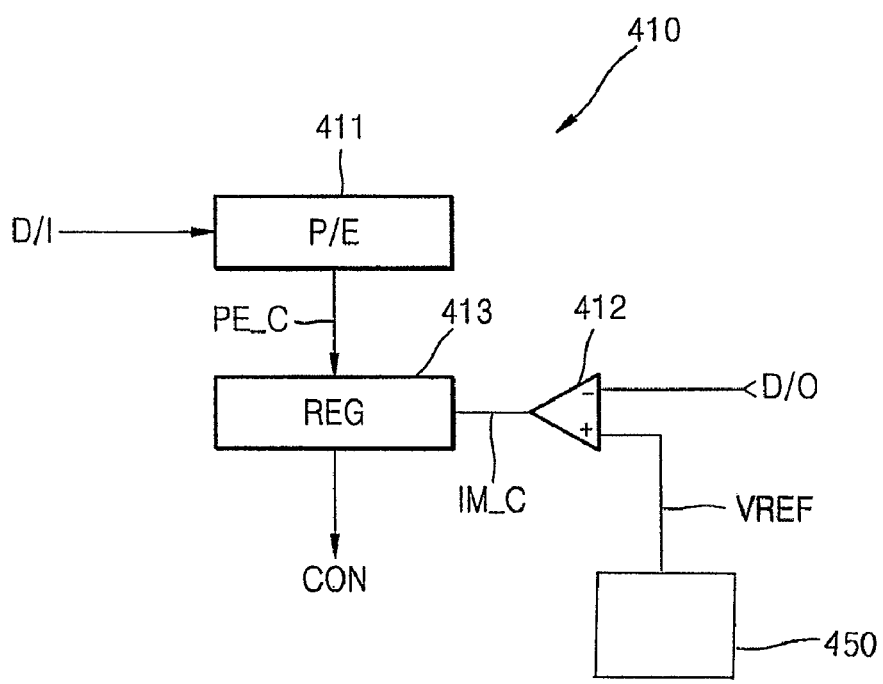
FIG. 5 is a block diagram of the internal structure of the control circuit of FIG. 4.

FIG. 5 is a block diagram of the internal structure of the control circuit of FIG. 4.

Referring to FIG. 5, a control circuit 410 includes a pre-emphasis circuit 411, an impedance matching circuit 412, and a resistor circuit 413.

The pre-emphasis circuit 411 detects edges of the input signal D/I, and outputs a pre-emphasis control signal PE_C which indicates whether the input signal D/I is to be amplified for a predetermined time period at a rising edge and a falling edge. Although not shown, the pre-emphasis circuit 411 includes at least one edge detector which detects edges of the input signal D/I.

In response to the output signal D/O and a reference signal Vref provided by a reference voltage generating circuit 450, the impedance matching circuit 412 outputs an impedance matching control signal IM_C which indicates whether the output impedance of the dynamic output circuit matches the characteristic impedance of the metal line. In one embodiment, the reference signal Vref has a median value in the swing range of the peak-to-peak voltage of the output signal D/O of the dynamic output buffer circuit. Although not shown, the impedance matching circuit 412 includes a reference voltage generating circuit which generates the reference voltage Vref. The impedance matching circuit 412 includes at least one comparator of which a first input terminal receives the output signal D/O, a second input terminal receives the reference voltage Vref, and an output terminal is connected to the resistor circuit 413.

In response to the pre-emphasis control signal PE_C and the impedance matching control signal IM_C, the resistor circuit 413 outputs resistor control signals CON. The resistor circuit 413 modifies the resistor control signals CON in response to the impedance matching control signal IM_C and the pre-emphasis control signal PE_C. The resistor control signals CON continue to be modified until the impedance matching signal IM_C and the pre-emphasis control signal PE_C indicate that the modification is no longer needed.

Figure 6:
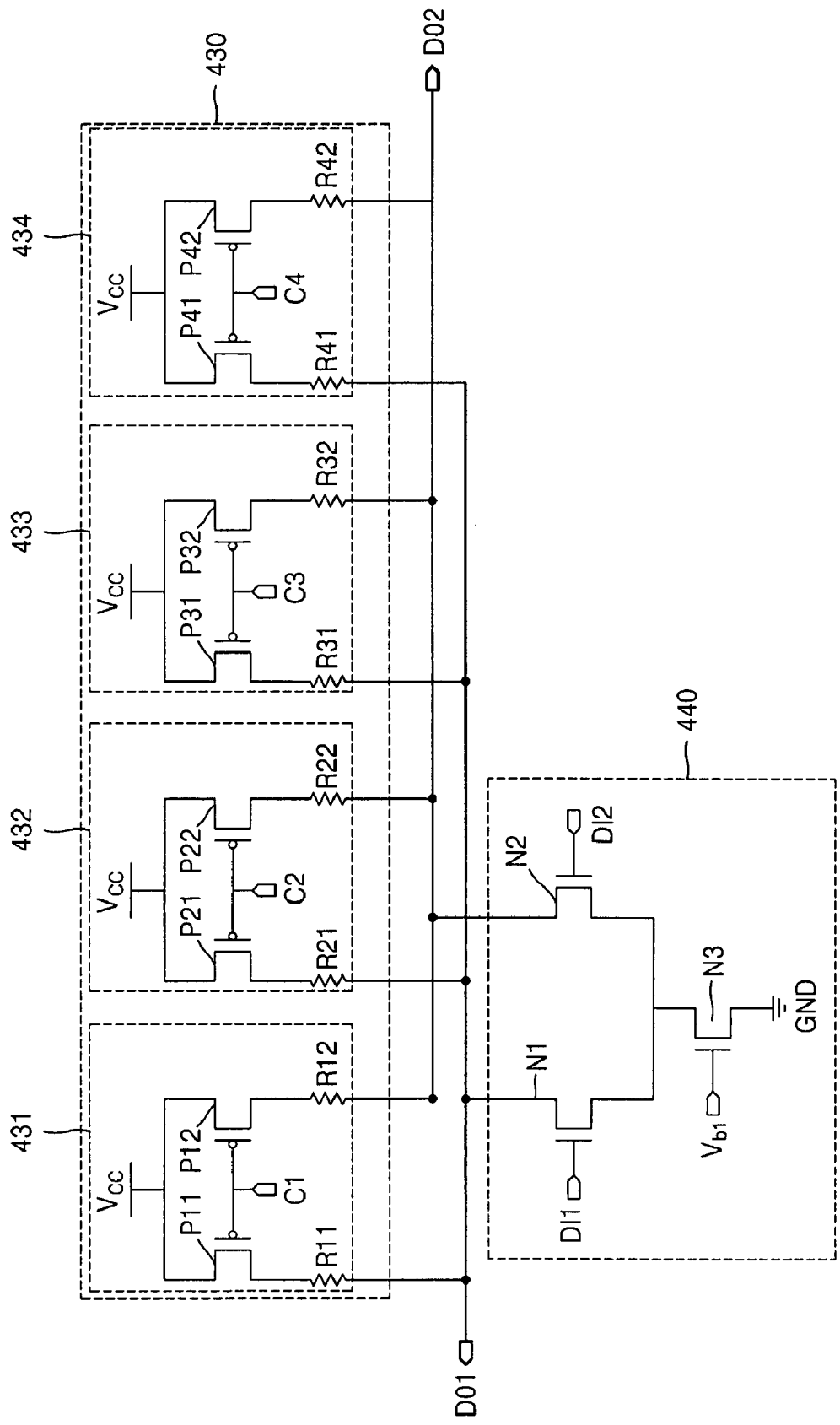
FIG. 6 is a circuit diagram illustrating the internal structure of the output circuit of FIG. 4.

FIG. 6 is a circuit diagram illustrating the internal structure of the output circuit of FIG. 4.

Referring to FIG. 6, an output circuit includes a dynamic ODT 430 and an input stage 440. Here, an output signal D01, D02, . . . has the same reference numeral as an output terminal through which the output signal is output.

The dynamic ODT 430 operates in response to the resistor control signals CON, labeled in FIG. 6 as C1, C2, . . . Cn, and is connected to output terminals DO1 and DO2 outputting output signals DO1 and DO2. The dynamic ODT 430 includes a plurality of ODT blocks 431, 432, 433, 434, . . . . Each of the ODT blocks 431 . . . 434 includes two MOS transistors and two resistors. Although for convenience only four ODT blocks are shown in FIG. 6, the present invention may include more than or less than four ODT blocks.

The first ODT block 431 includes: a MOS transistor P11 of which a first terminal is connected to a first power voltage Vcc and of which a gate receives a first resistor control signal C1; a MOS transistor P12 of which a first terminal is connected to the first power voltage Vcc, and of which a gate receives the first resistor control signal C1; a resistor R11 of which a first terminal is connected to a second terminal of the MOS transistor P11, and of which a second terminal is connected to a first output terminal DO1; and a resistor R12 of which a first terminal is connected to a second terminal of the MOS transistor P12, and of which a second terminal is connected to a second output terminal DO2.

The second ODT block 432 includes: a MOS transistor P21 of which a first terminal is connected to the first power voltage Vcc, and of which a gate receives a second resistor control signal C2; a MOS transistor P22 of which a first terminal is connected to the first power voltage Vcc, and of which a gate receives the second resistor control signal C2; a resistor R21 of which a first terminal is connected to a second terminal of the MOS transistor P21, and of which a second terminal is connected to the first output terminal DO1; and a resistor R22 of which a first terminal is connected to a second terminal of the MOS transistor P22, and of which a second terminal is connected to the second output terminal DO2.

Likewise, an Nth ODT block 434 can be described as follows.

The Nth ODT (not shown) includes: a MOS transistor PN1 of which a first terminal is connected to the first power voltage Vcc, and of which a gate receives an Nth resistor control signal CN; a MOS transistor PN2 of which a first terminal is connected to the first power voltage Vcc, and of which a gate receives the Nth resistor control signal CN; a resistor RN1 of which a first terminal is connected to a second terminal of the MOS transistor PN1, and of which a second terminal is connected to the first output terminal DO1; and a resistor RN2 of which a first terminal is connected to a second terminal of the MOS transistor PN2, and of which a second terminal is connected to the second output terminal DO2.

In one example, resistors included in one ODT block have the same resistance, and resistors included in an ODT block of the next higher stage have double that resistance. For example, the resistor R11 has the same resistance as the resistor R12, and the resistor R21 has the same resistance as the resistor R22. On the other hand, the resistor R21 has twice the resistance of the resistor R11, and the resistor R31 has twice the resistance of the resistor R21.

The input stage 440 includes: a first input transistor N1 of which a first terminal is connected to the first output terminal DO1, and of which a gate receives a first input signal DI1; a second input transistor N2 of which a first terminal is connected to the second output terminal DO2, and of which a gate receives a second input signal DI2; and a bias transistor N3 of which a first terminal is connected to a second terminal of the first input transistor N1 and a second terminal of the second input transistor N2, of which a second terminal is connected to a second power voltage GND, and of which a gate receives a bias signal Vb1.

Referring to FIGS. 4, 5, and 6, a dynamic output buffer circuit according to an embodiment of the present invention generates a pre-emphasis control signal PE_C which indicates portions where the input signal DI1 and/or the input signal DI2 make a transition, and allows that portion to be pre-emphasized. Furthermore, the dynamic output buffer circuit generates an impedance matching control signal IM_C so as to match the output impedance with the characteristic impedance Zo of the metal line of FIG. 4.

The pre-emphasis control signal PE_C and the impedance matching control signal IM_C are used to the generate resistor control signals CON, or C1 . . . C4, which are used to enable the ODT blocks 431 to 434. That is, the resistor control signals C1 . . . C4 are initially set to a predetermined logic value, and thereafter the resistor control signals are generated in response to the pre-emphasis control signal PE_C and the impedance matching control signal IM_C. In this manner, the impedance matching function and the pre-emphasis function can be achieved using only a single output circuit 420 and a single control circuit 410.

Figure 3:
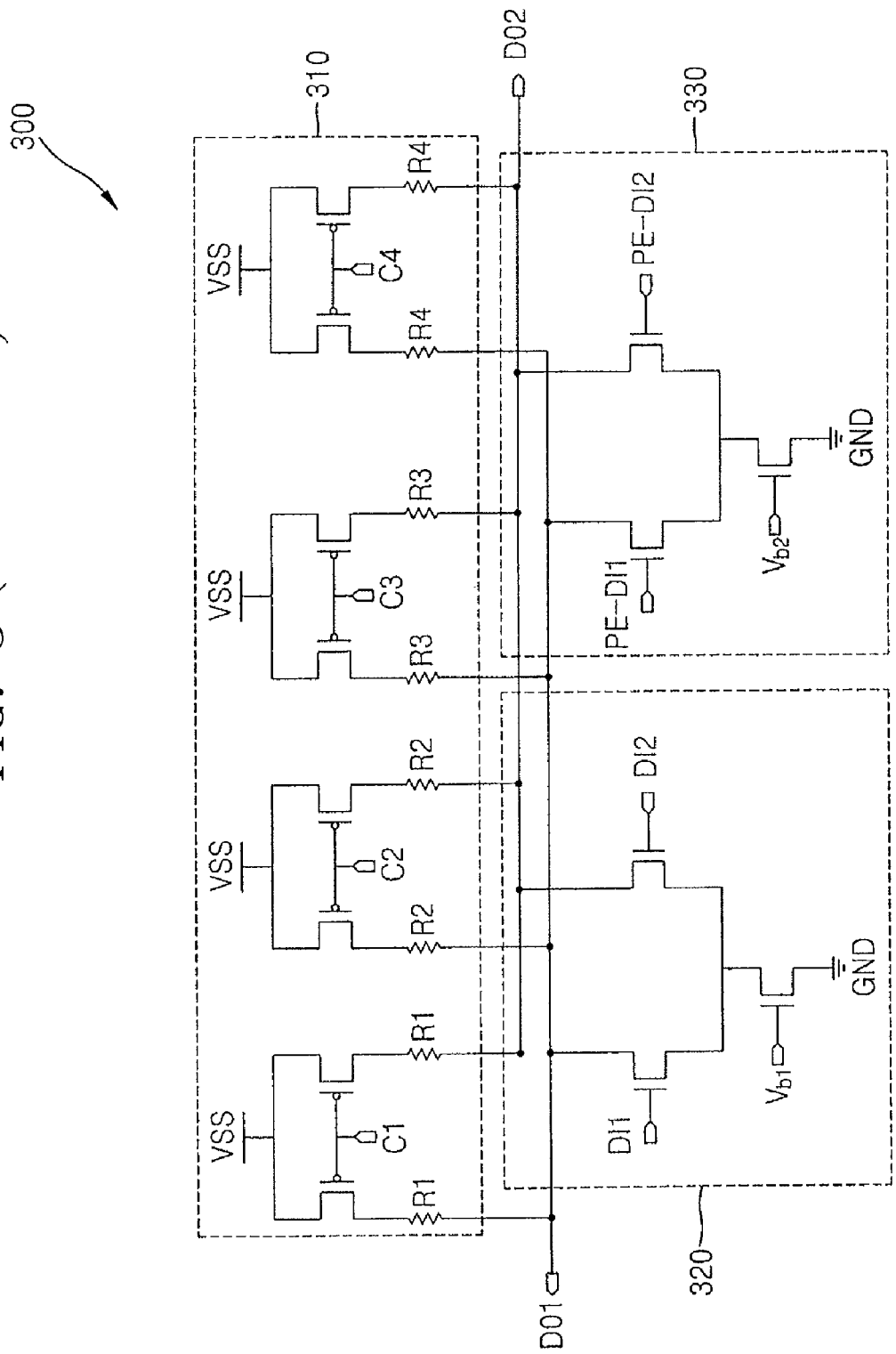
FIG. 3 illustrates an output circuit which performs an impedance matching function and a pre-emphasis function.

When the conventional output buffer circuit of FIG. 3 is used, a circuit for performing the impedance matching function and a circuit for performing the pre-emphasis function are additionally required, and thus the output buffer circuit occupies a relatively larger layout area. On the other hand, the impedance matching function and the pre-emphasis function do not interfere with each other because they are designed to operate independently. However, since a static output impedance which is determined using the impedance matching function is, in effect, influenced by the operation of the pre-emphasis circuit, the initially adjusted output impedance may vary.

Rather than employing the conventional pre-emphasis circuit, embodiments in accordance with the present invention dynamically adjust the on-die termination ODT 430 used for impedance matching, so as to perform the pre-emphasis function at the same time. The term "dynamic" is used herein to distinguish from the case where the conventional output buffer circuit employs a static output impedance of the ODT block 430 by performing an irreversible fusing operation. In the dynamic output buffer circuit according to an embodiment of the present invention, various stages of the ODT 430 block can be enabled or disabled in response to the resistor control signals C1 to C4 or CON. Furthermore, according to embodiments of the present invention, not only the impedance matching function, but also the pre-emphasis function, can be performed in dynamic fashion.

Since the dynamic output buffer circuit is to be connected to all output terminals of a semiconductor chip, product competitiveness can be improved by reducing layout area and power consumption.

According to a dynamic output buffer circuit of the present invention, relatively lower layout area is required, and relatively less power is consumed. In addition, an impedance matching function and a pre-emphasis function can be automatically performed by an internal circuit of a semiconductor chip.

While the exemplary embodiments of the present invention have been particularly shown and described, it will be understood by those skilled in the art that various changes in form and detail may be made herein without departing from the spirit and scope of the invention as defined by the appended claims. The exemplary embodiments should be considered in a descriptive sense only and not for purposes of limitation. Therefore, the scope of the invention is defined not by the detailed description of the invention but by the appended claims, and all differences within the scope will be construed as being included in the present invention.

What is claimed is:

1. A dynamic output buffer circuit which matches an output impedance to a characteristic impedance of a metal line connected to an external circuit, and pre-emphasizes at least one input signal, the dynamic output buffer circuit comprising:

a control circuit which matches the output impedance of the dynamic output buffer circuit to the characteristic impedance of the metal line in response to at least one output signal of the dynamic output buffer circuit, and outputs a plurality of resistor control signals which are used to pre-emphasize at least one input signal in response to the input signal; and an output circuit which controls the output impedance and pre-emphasizes the input signal in response to the resistor control signals, and which outputs the output signal, wherein the control circuit comprises:

a pre-emphasis circuit which detects edges of the input signal, and outputs a pre-emphasis control signal indicating that the input signal is to be amplified for a time period relative to a rising edge and a falling edge of the input signal;

an impedance matching circuit which outputs an impedance matching control signal indicating whether the output impedance of the dynamic output circuit matches the characteristic impedance of the metal line, in response to the output signal and a reference signal; and a resistor circuit which outputs the resistor control signals in response to the pre-emphasis control signal and the impedance matching control signal.

2. The dynamic output buffer circuit of claim 1 wherein the pre-emphasis circuit comprises at least one edge detector which detects edges of the input signal.

3. The dynamic output buffer circuit of claim 1, wherein the reference signal has a voltage value in a peak-to-peak voltage range of the output signal of the dynamic output buffer circuit.

4. The dynamic output buffer circuit of claim 1, wherein the control circuit further comprises a reference voltage generating circuit which generates the reference voltage.

5. The dynamic output buffer circuit of claim 1, wherein the impedance matching circuit comprises at least one comparator of which a first input terminal receives the output signal, a second input terminal receives the reference voltage, and an output terminal is connected to the resistor circuit.

6. The dynamic output buffer circuit of claim 1, wherein the resistor circuit modifies the resistor control signals in response to the impedance matching control signal and the pre-emphasis control signal.

7. A dynamic output buffer circuit which matches an output impedance to a characteristic impedance of a metal line connected to an external circuit, and pre-emphasizes at least one input signal, the dynamic output buffer circuit comprising:

a control circuit which matches the output impedance of the dynamic output buffer circuit to the characteristic impedance of the metal line in response to at least one output signal of the dynamic output buffer circuit, and outputs a plurality of resistor control signals which are used to pre-emphasize at least one input signal in response to the input signal; and an output circuit which controls the output impedance and pre-emphasizes the input signal in response to the resistor control signals, and which outputs the output signal, wherein the output circuit comprises:

a dynamic ODT (on die termination) which operates in response to the resistor control signals, and is connected to an output terminal that outputs the output signal; and an input stage which operates in response to the input signal, and is connected to the output terminal, wherein the dynamic ODT comprises:

a first ODT block which operates in response to a first resistor control Signal;

a second ODT block which operates in response to a second resistor control signal; and an Nth ODT block which operates in response to an Nth resistor control signal, where N is an integer, wherein the first ODT block comprises:

a first MOS transistor of which a first terminal is connected to a first power voltage, and of which a gate receives the first resistor control signal;

a second MOS transistor of which a first terminal is connected to the first power voltage, and of which a gate receives the first resistor control signal;

a first resistor of which a first terminal is connected to a second terminal of the first MOS transistor, and of which a second terminal is connected to a first output terminal; and a second resistor of which a first terminal is connected to a second terminal of the second MOS transistor, and of which a second terminal is connected to a second output terminal;

wherein the second ODT block comprises:

a first MOS transistor of which a first terminal is connected to the first power voltage, and of which a gate receives the second resistor control signal;

a second MOS transistor of which a first terminal is connected to the first power voltage, and of which a gate receives the second resistor control signal;

a first resistor of which a first terminal is connected to a second terminal of the first MOS transistor, and of which a second terminal is connected to the first output terminal; and a second resistor of which a first terminal is connected to a second terminal of the second MOS transistor, and of which a second terminal is connected to the second output terminal; and wherein the Nth ODT comprises:

a first MOS transistor PN1 of which a first terminal is connected to the first power voltage, and of which a gate receives the Nth resistor control signal;

a second MOS transistor of which a first terminal is connected to the first power voltage, and of which a gate receives the Nth resistor control signal;

a first resistor of which a first terminal is connected to a second terminal of the first MOS transistor, and of which a second terminal is connected to the first output terminal; and a second resistor of which a first terminal is connected to a second terminal of the second MOS transistor, and of which a second terminal is connected to the second output terminal.

8. The dynamic output buffer circuit of claim 7, wherein resistors included in a same one of the first, second and Nth ODT blocks all have the same resistance, and resistors included in a next higher order ODT block all have double that resistance.

9. The dynamic output buffer circuit of claim 7, wherein the input stage comprises:

a first input transistor of which a first terminal is connected to the first output terminal, and of which a gate receives the first input signal;

a second input transistor of which a first terminal is connected to the second output terminal, and of which a gate receives the second input signal; and a bias transistor of which a first terminal is connected to a second terminal of the first input transistor and a second terminal of the second input transistor, of which a second terminal is connected to a second power voltage, and of which a gate receives a bias signal.

* * * * *